(12) United States Patent
Chen et al.

(10) Patent No.: US 10,510,401 B2
(45) Date of Patent: Dec. 17, 2019

(54) SEMICONDUCTOR MEMORY DEVICE USING SHARED DATA LINE FOR READ/WRITE OPERATION

(71) Applicant: Taiwan Semiconductor Manufacturing Company Limited, Hsinchu (TW)

(72) Inventors: Chien-Yuan Chen, Hsinchu (TW); Che-Ju Yeh, Kaohsiung (TW); Hau-Tai Shieh, Hsinchu (TW); Cheng-Hung Lee, Hsinchu (TW); Hung-Jen Liao, Hsinchu (TW); Sahil Preet Singh, Hsinchu (TW); Manish Arora, Hsinchu (TW); Hemant Patel, Hsinchu (TW); Li-Wen Wang, Taichung (TW)

(73) Assignee: Taiwan Semicondutor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/980,815

(22) Filed: May 16, 2018

(65) Prior Publication Data

US 2018/0336944 A1 Nov. 22, 2018

Related U.S. Application Data

(60) Provisional application No. 62/509,271, filed on May 22, 2017.

(51) Int. Cl.
*G11C 11/419* (2006.01)
(52) U.S. Cl.
CPC ................................ *G11C 11/419* (2013.01)

(58) Field of Classification Search
CPC .............. G11C 11/419; G11C 11/1673; G11C 11/1675; G11C 11/1693; G11C 11/2275; G11C 11/413; G11C 8/12
See application file for complete search history.

(56) References Cited

U.S. PATENT DOCUMENTS

| | | | |
|---|---|---|---|
| 8,116,149 B2 * | 2/2012 | Chen | G11C 11/413 365/189.02 |
| 8,792,288 B1 * | 7/2014 | Bartling | G11C 29/36 365/164 |
| 8,854,079 B2 * | 10/2014 | Bartling | H03K 19/173 326/38 |
| 8,854,858 B2 * | 10/2014 | Bartling | G11C 11/419 365/117 |
| 10,043,563 B2 * | 8/2018 | Foong | G11C 11/1659 |

* cited by examiner

*Primary Examiner* — Gene N Auduong
(74) *Attorney, Agent, or Firm* — Jones Day

(57) ABSTRACT

A semiconductor memory device comprising a plurality of memory cells configured to store digital data and an input multiplexer configured to enable the selection of a particular memory cell from the plurality of memory cells. The semiconductor memory device further comprises a read/write driver circuit configured to read data from the selected memory cell and write data to the selected memory cell, and a write logic block configured to provide logical control to the read/write driver circuit for writing data to the selected of memory cell. The read/write driver circuit may be coupled to the read/write input multiplexer by a data line and an inverted data line and the read and the write operations to the selected memory cell occur over the same data line and inverted data line.

20 Claims, 14 Drawing Sheets

WRITE 0

WRITE 1

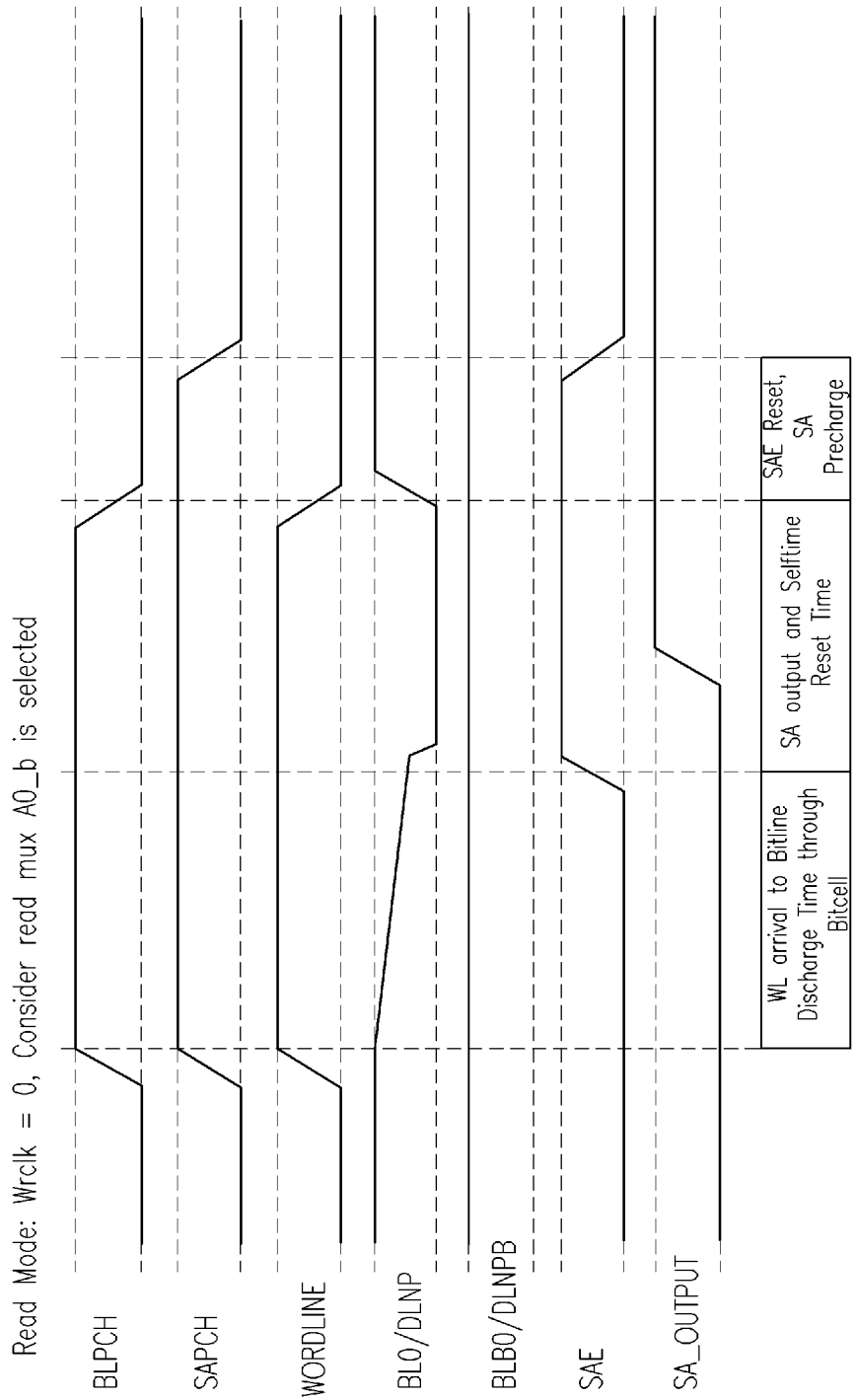

ated in FIG.

SEMICONDUCTOR MEMORY DEVICE USING SHARED DATA LINE FOR READ/WRITE OPERATION

CROSS-REFERENCE TO RELATED APPLICATIONS

This application claims priority to U.S. Provisional Application No. 62/509,271, filed May 22, 2017, entitled "Combined Read/Write Circuit for Semiconductor Memory Device," which is incorporated herein by reference in its entirety.

TECHNICAL FIELD

This relates to semiconductor memory devices and more particularly to combined read/write circuits for semiconductor memory devices.

BACKGROUND

Semiconductor memory devices store digital data in memory cells. One type of semiconductor memory device is a static random access memory (SRAM) device. SRAM devices, like other forms of semiconductor memory cells, typically include circuitry to enable the digital data to be written into the memory cells and read out of the memory cells. These circuits are referred to as write circuits and read circuits, respectively.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B are timing diagrams illustrating exemplary operation of the schematic illustrated in FIGS. 6-8 in accordance with some embodiments.

DETAILED DESCRIPTION

Figure 1:
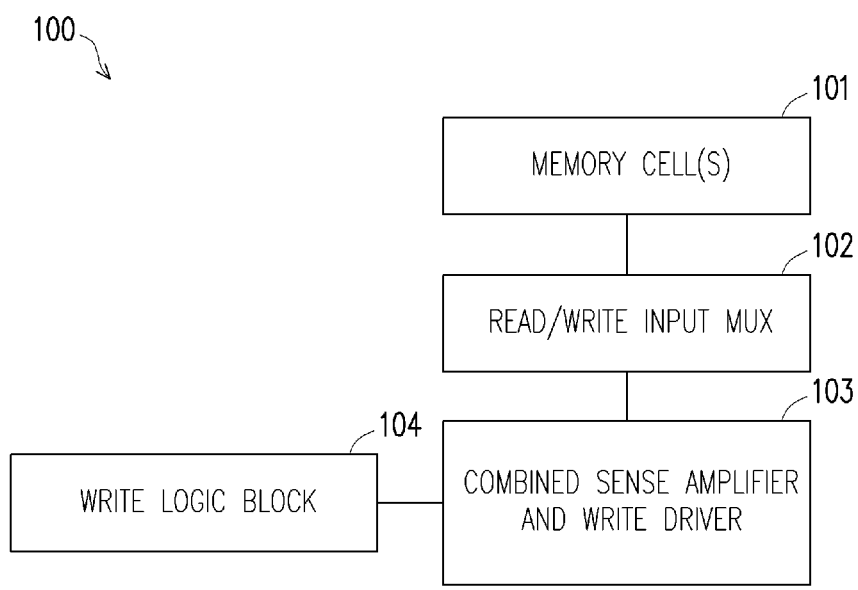
FIG. 1 is a schematic diagram illustrating an example of a combined read/write circuit for a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Semiconductor memory devices typically include significant numbers of memory cells. Read and write circuits associated with semiconductor memory devices, including static random access memory (SRAM) devices, may be utilized to address individual cells and read and/or write data to the desired cell. Read and write circuits consume power and occupy area within semiconductor memory devices and it may be desirable to reduce or minimize the power consumed by the read and write circuits, leakage current associated with such circuits and/or the area occupied by these circuits.

Accordingly, in some embodiments described herein, read and/or write circuits with reduced power consumption, reduced size, and/or reduced leakage current may be provided. In some embodiments, the read and write circuits may be combined into a single circuit. In some embodiments, the read path and write path associated with the semiconductor memory device (e.g., SRAM) may be combined. In some embodiments, a sense amplifier may be implemented to perform both the read and write operation associated with the memory device. In some embodiments, the devices and structures described herein may reduce the amount of leakage current per input/output operation. For example, in some embodiments, the reduction could be about 12% or about 40% or about 50%.

FIG. 1 is a schematic diagram illustrating an example of a combined read/write circuit for a memory device in accordance with some embodiments. As illustrated in FIG. 1, the semiconductor memory device (e.g., SRAM, DRAM, RRAM combined with SRAM logic) 100 includes a memory cell 101 configured to store bits of data and a read/write input multiplexer 102. The read/write input multiplexer 102 may be configured to select specific bit lines within the memory cell 101 for read and/or write operations. The semiconductor memory device 100 also includes a combined sense amplifier and write driver circuit 103 configured to read data from the memory cell 101 and write data to the memory cell 101. The write operation to the memory cell 101 may be assisted by a write logic block 104.

Figure 2:
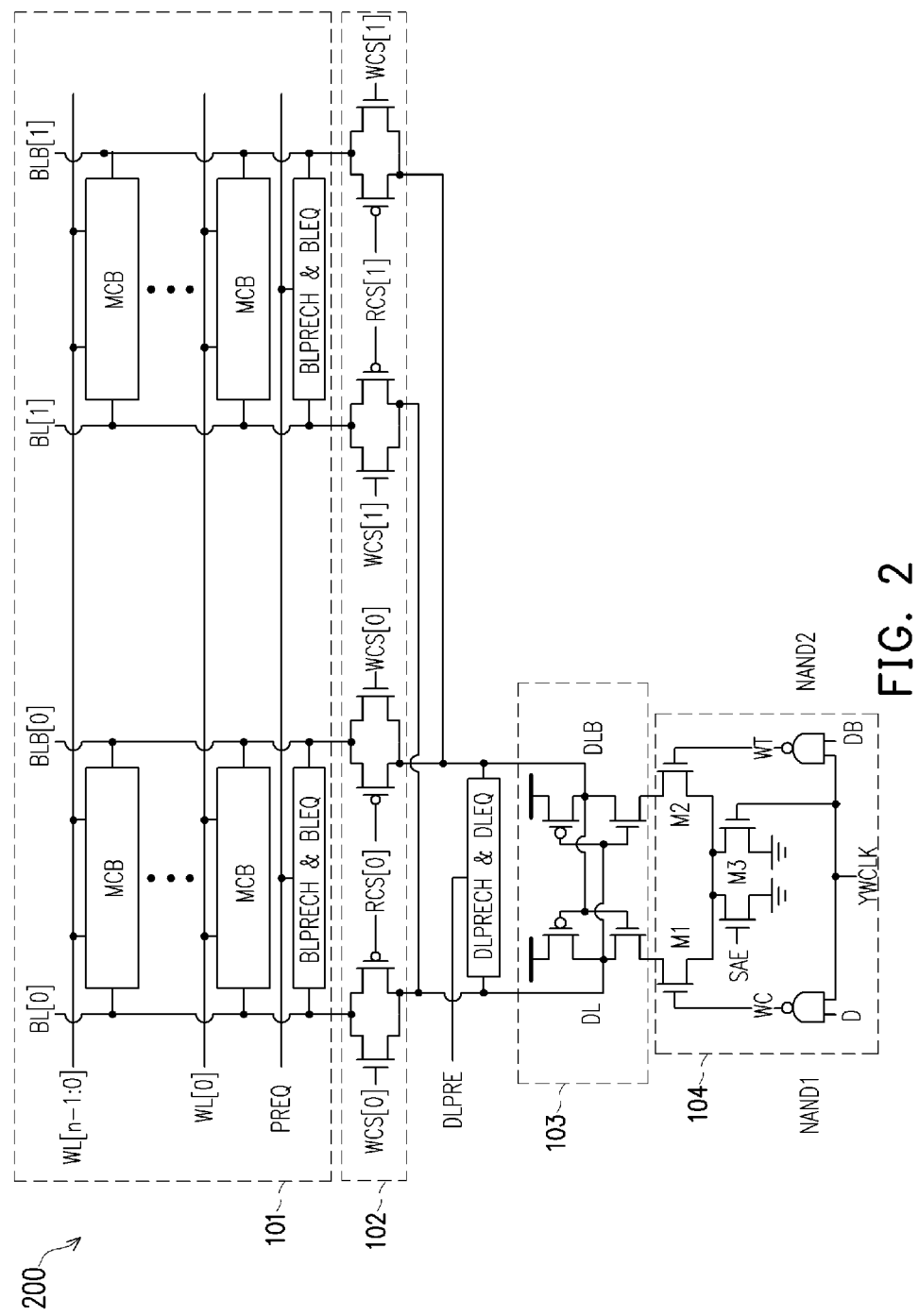
FIG. 2 is a schematic diagram illustrating another example of a combined read/write circuit for a memory device in accordance with some embodiments.

FIG. 2 is a schematic diagram illustrating another example of a combined read/write circuit for a memory device in accordance with some embodiments. As illustrated in FIG. 2, the semiconductor memory device (e.g., SRAM) 200 includes a memory cell 101. The memory cell 101 may include a plurality of memory cell blocks (MCB) and word lines (WL) and bit lines (BL) for addressing specific cells within the memory cell blocks (MCB). The memory cell 101 may also include bit line pre-charge (BLPRECH) and/or bit line equalizer (BLEQ) circuits. The bit line pre-charge (BLPRECH) and bit line equalizer (BLEQ) circuits pre-charge the bit line (BL) and the inverted bit line (BLB) to a predetermined voltage and maintains or equalizes the voltage between the two lines. In some embodiments, this operation aides with the read operation performed by the sense amplifier. The semiconductor memory device 200 also includes a read/write input multiplexer 102 that may comprise a pair of MOS transistors for each bit line (BL) and each inverted bit line (BLB). For example, as illustrated in FIG. 2, the transistors associated with bit line (BL[0]) include an NMOS write transistor which is switched on/off using signal WCS[0] and a PMOS read transistor which is switched on/off using signal RCS[0].

The semiconductor memory device 200 also includes a combined sense amplifier and write driver circuit 103 configured to read data from the memory cell 101 and write data to the memory cell 101. During the read operation, the sense amplifier 103 detects a voltage difference between data line (DL) and inverted data line (DLB) and amplifies the difference between the voltages so the data can be interpreted as a logical 0 or 1. As illustrated in FIG. 2, the sense amplifier includes a pair of PMOS transistors and a pair of NMOS transistors.

The semiconductor memory device 200 also includes a write logic block 104 which includes a differential pair of MOS (NMOS) transistors M1, M2 and a switch implemented in FIG. 2 using NMOS transistor M3. In operation, the switch M3 is activated using clock signal (YWCLK) and the differential pair of MOS transistors M1, M2 are activated using input signals (WC, WT). The signals WC and WT may be controlled using corresponding NAND gates (NAND1 and NAND2) as illustrated.

When WC and WT are both logical high values (i.e., a logical 1), NMOS transistors M1, M2 are both turned ON such that the transistors are effectively shorted between the source and the drain. This causes M1 and M2 to effectively disappear so that the combined sense amplifier and driver circuit 103 is directly coupled to M3. As a result, the effective circuit becomes a sense amplifier circuit capable of reading data from the memory cell 101. When WC is a logical low value (i.e., logical 0) and WT is a logical high value (i.e., logical 1), NMOS transistor M1 is OFF and NMOS transistor M2 is turned ON. As a result, data line (DL) is a logical high value and data line (DLB) is a logical low value. These voltages are transferred to the corresponding bit line (BL) and inverted bit line (BLB) via the read/write input multiplexer 102. This causes a logical high value to be written into the corresponding memory location. When WC is a logical high value (i.e., logical 1) and WT is a logical low value (i.e., logical 0), NMOS transistor M1 is ON and NMOS transistor M2 is turned OFF. As a result, data line (DL) is a logical low value and data line (DLB) is a logical high value. These voltages are transferred to the corresponding bit line (BL) and inverted bit line (BLB) via the read/write input multiplexer 102. This causes a logical low value to be written into the corresponding memory location. These modes of operation are discussed in more detail below.

Accordingly, the semiconductor memory device 200 illustrated in FIG. 2 is capable of performing read and write operations without a separate write circuit, rather a smaller write logic block 104 is configured to utilize the existing sense amplifier structure to write data to the memory cells 101. As a result, the read and write operations occur over a shared data line (DL, DLB). Also illustrated in FIG. 2 are the BLPRECH & BLEQ and DLPRECH & DLEQ which are provided to pre-charge and equalize the bit line in the memory cells 101 and the data lines DL and DLB. These structures operate to precharge the voltage on its respective line between a logical low value and a logical high value. In this manner, when a particular line (e.g., BL[0] and BLB[0]) switches state, the transition only take a fraction of the time (e.g., half the time) otherwise required to transition from one logical state to the other. In some embodiments, the transition time may be reduced because the voltage on the respective line is already partially transitioned (i.e., the voltage is somewhere between the starting and ending voltage). For example, to transition from a logical low value (e.g., 0 Volts) to a logical high value (e.g., Vcc Volts), the bit line may be precharged to Vcc/2 Volts. In this manner, when the state is actually switched, the transition is from Vcc/2 to Vcc instead of from 0 to Vcc—which takes less time (e.g., half the time). In some embodiments, this may be acceptable because a precharged voltage is still considered a logical low value.

Figure 3A:
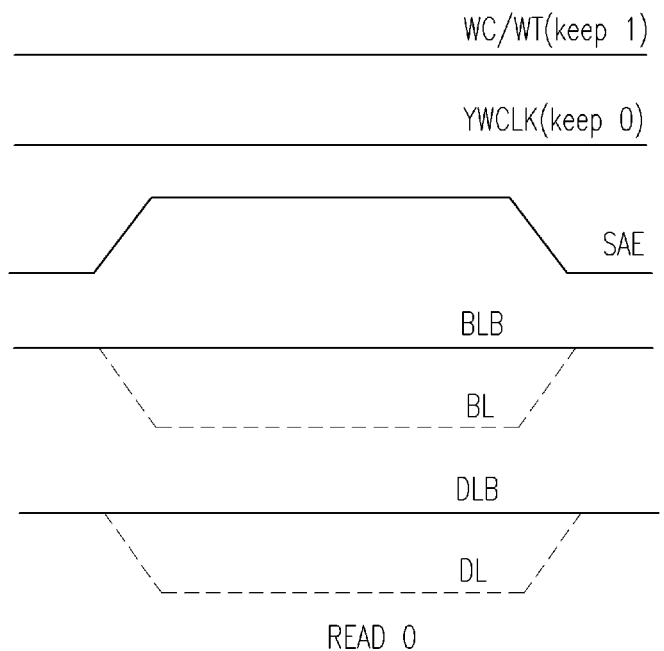
FIGS. 3A-3D are timing diagrams illustrating exemplary operation of the schematic illustrated in FIG. 2 in accordance with some embodiments.
Figure 3B:
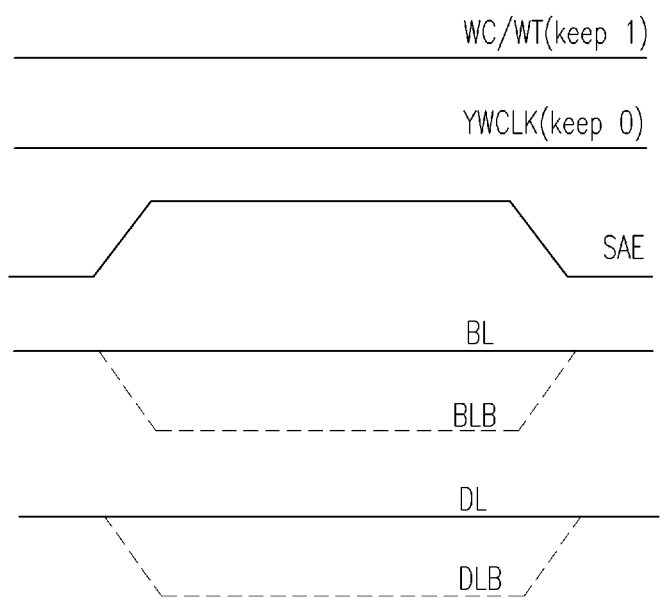
Figure 3C:
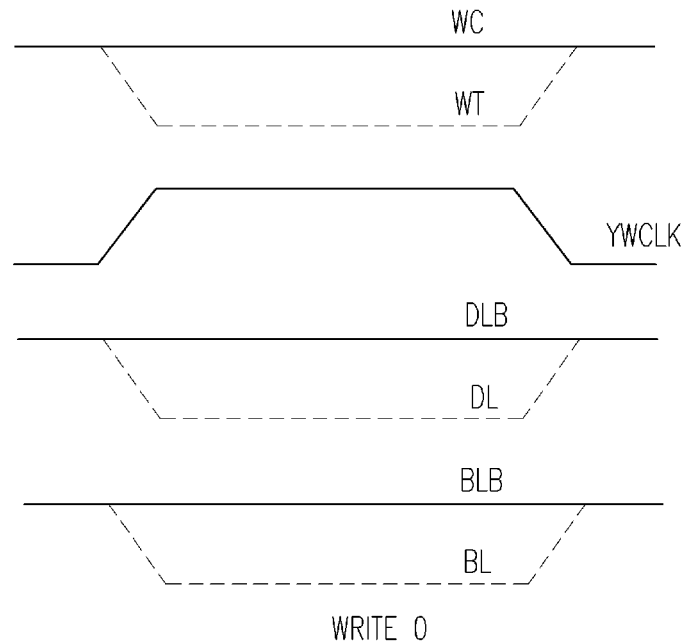
Figure 3D:
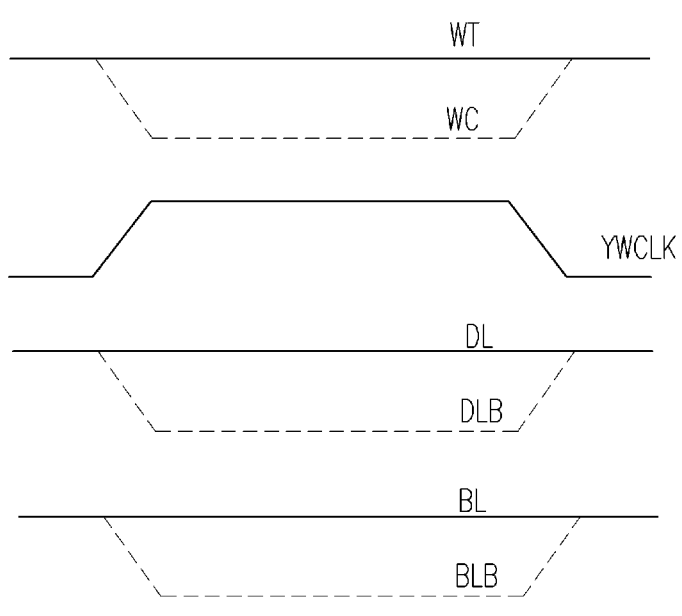

FIGS. 3A-3D are timing diagrams illustrating exemplary operation of the schematic illustrated in FIG. 2 in accordance with some embodiments. In particular, FIG. 3A illustrates the operation of the circuit in FIG. 2 during a read 0 operation, FIG. 3B illustrates the operation of the circuit in FIG. 2 during a read 1 operation, FIG. 3C illustrates the operation of the circuit in FIG. 2 during a write 0 operation, and FIG. 3D illustrates the operation of the circuit in FIG. 2 during a write 1 operation. As illustrated in FIG. 3A, during the read 0 operation, signal WC and WT signals are maintained at a logical high value (1) and signal YWCLK is maintained at a logical low value (0). Signal SAE is transitioned from a logical low value (0) to a logical high value (1) and the data at BL is transferred to the signal line DL. In the case of FIG. 3A, the data is a logical low value (0). The operation of the circuit to read a logically high value (1) is illustrated in FIG. 3B and as can be readily seen, the WC, WT, YWCLK, and SAE operate in an identical fashion to read the data at BL. In this case, that data is a logical high value (1) and it is transferred to signal line DL.

The write 0 operation is illustrated in FIG. 3C. As illustrated, WC is maintained at a logically high value (1) and WT is toggled to a logical low value (0) in response to the transition of YWCLK from a logical low value to a logical high value (and the values of D and DB). This causes the DL to toggle to a logical low value (0) and that logical low state (0) is transferred to the bit-line BL. The write 1 operation is illustrated in FIG. 3D. As illustrated, WT is maintained at a logical high value (1) and WC is toggled to a logically low value (0) in response to the transition of YWCLK from a logical low value to a logical high value (and the values of D and DB). This causes the DLB to toggle to a logical low value (0) and that logical low state (0) is transferred to the bit-line BLB. The bit-line BL maintains (of toggles to) a logical high value (1).

Figure 4:
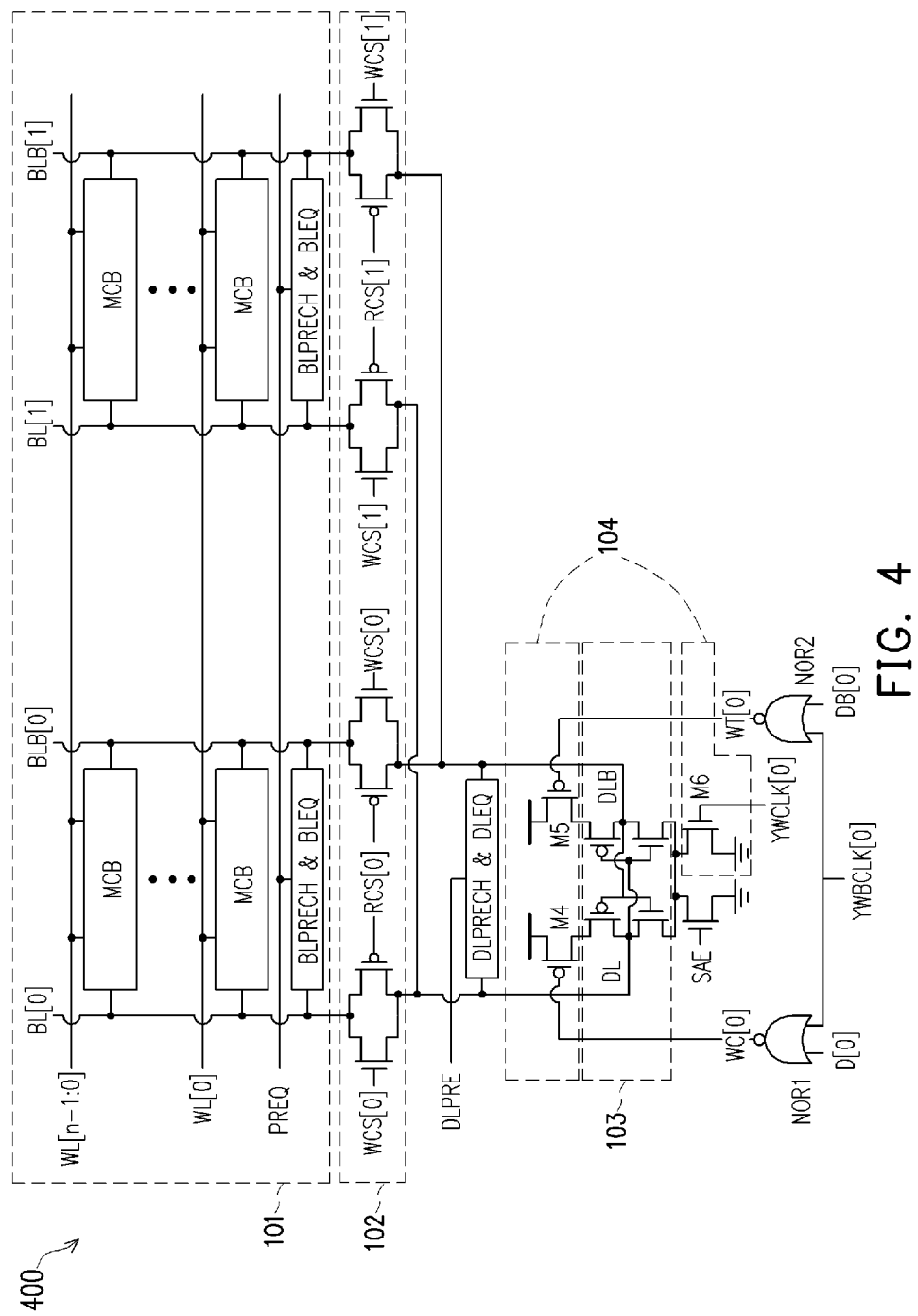
FIG. 4 is a schematic diagram illustrating another example of a combined read/write circuit for a memory device in accordance with some embodiments.

FIG. 4 is a schematic diagram illustrating another example of a combined read/write circuit for a memory device in accordance with some embodiments. As illustrated in FIG. 4, the semiconductor memory device (e.g., SRAM) 400 is similar to the device illustrated in FIG. 2. Semiconductor memory device 400 includes a memory cell 101 with a plurality of memory cell blocks (MCB) and word lines (WL) and bit lines (BL) for addressing specific cells within the memory cell blocks (MCB). The memory cell 101 also includes bit line pre-charge (BLPRECH) and/or bit line equalizer (BLEQ) circuits. The bit line pre-charge (BLPRECH) and bit line equalizer (BLEQ) circuits pre-charge the bit line (BL) and the inverted bit line (BLB) to a predetermined voltage and maintains or equalizes the voltage between the two lines. The semiconductor memory device 400 also includes a read/write input multiplexer 102 that may comprise a pair of MOS transistors for each bit line (BL) and each inverted bit line (BLB). For example, as illustrated in FIG. 4, the transistors associated with bit line (BL[0]) include an NMOS write transistor which is switched on/off using signal WCS[0] and a PMOS read transistor which is switched on/off using signal RCS[0].

The semiconductor memory device 400 also includes a combined sense amplifier and write driver circuit 103 configured to read data from the memory cell 101 and write data to the memory cell 101. During the read operation, the sense amplifier 103 detects a voltage difference between data line (DL) and inverted data line (DLB) and amplifies the difference between the voltages so the data can be interpreted as a logical 0 or 1. As illustrated in FIG. 4, the sense amplifier includes a pair of PMOS transistors and a pair of NMOS transistors.

The semiconductor memory device 400 also includes a write logic block 104 which includes a differential pair of MOS (PMOS) transistors M4, M5 and a switch implemented in FIG. 2 using NMOS transistor M6. In operation, the switch M6 is activated using clock signal (YWCLK) and the differential pair of MOS transistors M4, M5 are activated using input signals (WC, WT). The signals WC and WT may be controlled using corresponding NOR gates (NOR1 and NOR2) as illustrated.

When WC and WT are both logical low values (i.e., a logical 0), PMOS transistors M4, M5 are both turned ON such that the transistors are effectively shorted between the source and the drain. This causes M4 and M5 to effectively disappear so that the combined sense amplifier and driver circuit 103 is directly coupled to M3 because they are shorted between the source and drain. As a result, the effective circuit becomes a sense amplifier circuit capable of reading data from the memory cell 101. When WC is a logical low value (i.e., logical 0) and WT is a logical high value (i.e., logical 1), PMOS transistor M4 is ON and PMOS transistor M5 is turned OFF. As a result, data line (DL) is a logical low value and data line (DLB) is a logical high value. These voltages are transferred to the corresponding bit line (BL) and inverted bit line (BLB) via the read/write input multiplexer 102. This causes a logical low value to be written into the corresponding memory location. When WC is a logical high value (i.e., logical 1) and WT is a logical low value (i.e., logical 0), PMOS transistor M4 is OFF and PMOS transistor M5 is turned ON. As a result, data line (DL) is a logical high value and data line (DLB) is a logical low value. These voltages are transferred to the corresponding bit line (BL) and inverted bit line (BLB) via the read/write input multiplexer 102. This causes a logical high value to be written into the corresponding memory location.

Accordingly, the semiconductor memory device 400 illustrated in FIG. 4 is capable of performing read and write operations without a separate write circuit, rather a smaller write logic block 104 is configured to utilize the existing sense amplifier structure to write data to the memory cells 101. As a result, the read and write operations occur over a shared data line (DL, DLB).

Figure 5A:
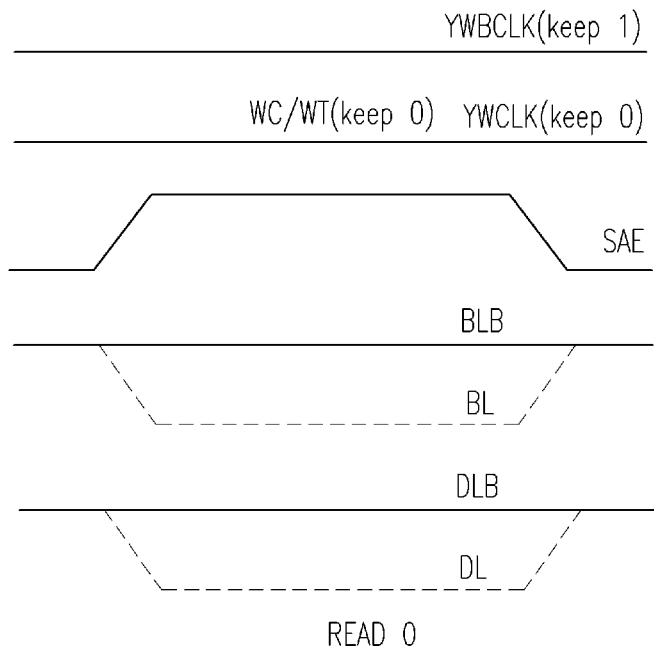
FIGS. 5A-5D are timing diagrams illustrating exemplary operation of the schematic illustrated in FIG. 4 in accordance with some embodiments.
Figure 5B:
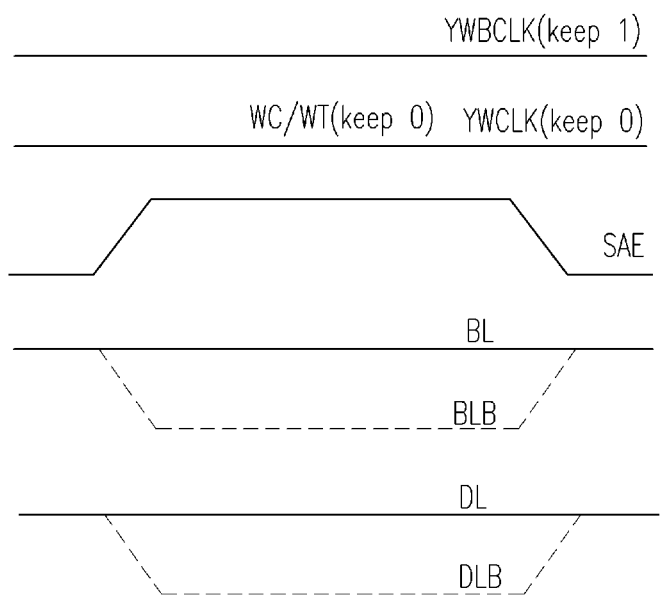
Figure 5C:
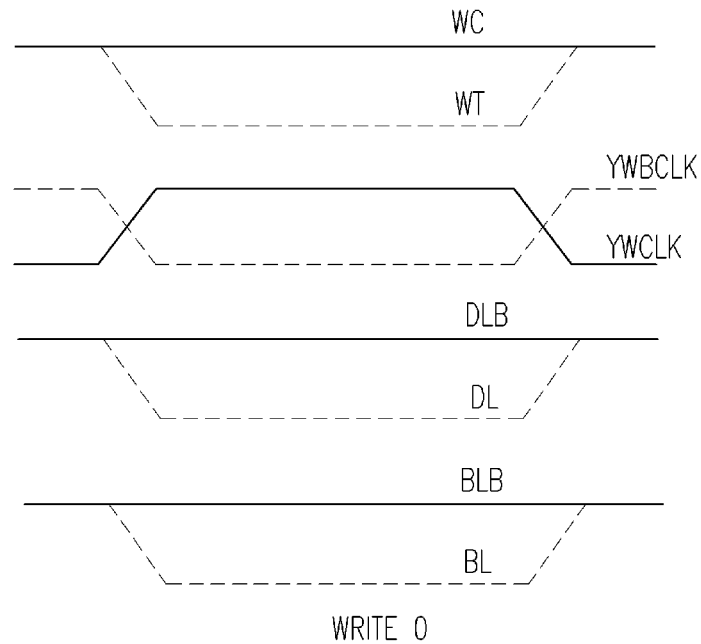
Figure 5D:
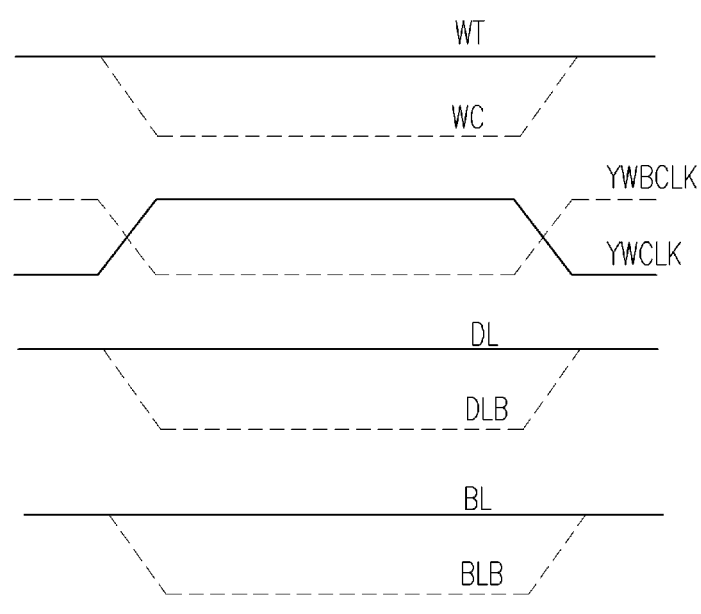

FIGS. 5A-5D are timing diagrams illustrating exemplary operation of the schematic illustrated in FIG. 4 in accordance with some embodiments. In particular, FIG. 5A illustrates the operation of the circuit in FIG. 4 during a read 0 operation, FIG. 5B illustrates the operation of the circuit in FIG. 4 during a read 1 operation, FIG. 5C illustrates the operation of the circuit in FIG. 4 during a write 0 operation, and FIG. 5D illustrates the operation of the circuit in FIG. 4 during a write 1 operation. As illustrated in FIG. 5A, during the read 0 operation, signal YWBCLK is maintained at a logical high value (1) and the WC, WT, and YWCLK signals are maintained at a logical low value (0). Signal SAE is transitioned from a logical low value (0) to a logical high value (1) and the data at BL is transferred to the signal line DL. In the case of FIG. 5A, the data is a logical low value (0). The operation of the circuit to read a logically high value (1) is illustrated in FIG. 5B and as can be readily seen, the WC, WT, YWCLK, YWBCLK, and SAE operate in an identical fashion to read the data at BL. In this case, that data is a logically high value (1) and it is transferred to signal line DL.

The write 0 operation is illustrated in FIG. 5C. As illustrated, WC is maintained at a logical high value (1) and WT is toggled to a logical low value (0) in response to the transition of YWCLK from a logically low value to a logical high value and YWBCLK from a logical high value (1) to a logical low value (0). This causes the DL to toggle to a logical low value (0) and that logical low state (0) is transferred to the bit-line BL. The write 1 operation is illustrated in FIG. 5D. As illustrated, WT is maintained at a logical high value (1) and WC is toggled to a logical low value (0) in response to the transition of YWCLK from a logical low value to a logical high value and YWBCLK from a logical high value (1) to a logical low value (0). This causes the DLB to toggle to a logical low value (0) and that logical low state (0) is transferred to the bitline BLB. The bit-line BL maintains (or toggles to) a logical high value (1).

Figure 6:
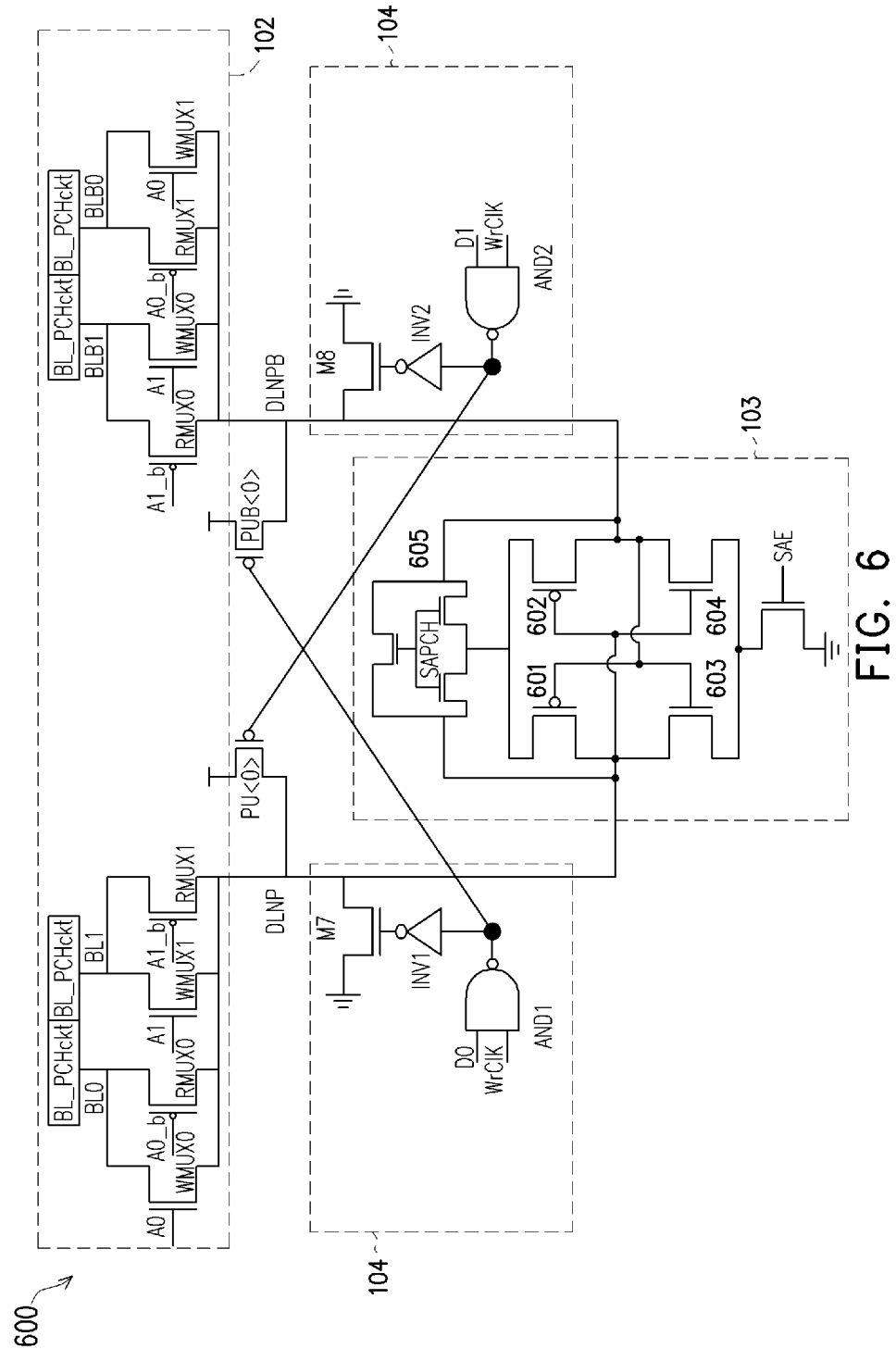
FIG. 6 is a schematic diagram illustrating another example of a combined read/write circuit for a memory device in accordance with some embodiments.

FIG. 6 is a schematic diagram illustrating another example of a combined read/write circuit for a memory device in accordance with some embodiments. The embodiment in FIG. 6, includes a semiconductor memory device (e.g., SRAM) 600. Although the memory cell is not illustrated in FIG. 6, in some embodiments, it may be similar to the memory cell 101 discussed previously. In addition, in FIG. 6, the memory cells would be coupled to the bit lines (BL, BLB) and the bit line pre-charge circuit (BL_PCHckt). As discussed above, the bit line pre-charge circuit (BL_PCHckt) in conjunction with a bit line equalizer circuit pre-charges the bit line (BL) and the inverted bit line (BLB) to a predetermined voltage and maintains or equalizes the voltage between the two lines. The semiconductor memory device 600 also includes a read/write input multiplexer 102 which may comprise a pair of MOS transistors for each bit line (BL) and each inverted bit line (BLB). For example, as illustrated in FIG. 6, the transistors associated with bit line (BL0) include an NMOS write transistor (WMUX0) which is switched on/off using signal A0 and a PMOS read transistor (RMUX0) which is switched on/off using an inverted A0 signal (A0_b).

The semiconductor memory device 600 also includes a combined sense amplifier and write driver circuit 103 configured to read data from a memory cell and write data to the memory cell. During the read operation, the sense amplifier 103 detects a voltage difference between data line (DLNP) and inverted data line (DLNPB) and amplifies the difference between the voltages so the data can be interpreted as a logical 0 or 1. As illustrated in FIG. 6, the sense amplifier includes a pair of PMOS transistors 601, 602 and a pair of NMOS transistors 603, 604. In FIG. 6, the sense amplifier 103 further includes a precharge circuit 605 comprising three NMOS transistors and coupled to the data lines (DLNP, DLNPB).

The semiconductor memory device 600 also includes a write logic block 104 coupled to data line DLNP which includes an AND gate (AND1), an inverter (INV1) and an NMOS transistor M7. A corresponding circuit is coupled to the inverted data line DLNPB and includes an AND gate (AND2), an inverter (INV2) and an NMOS transistor M8. Collectively, the AND gate (AND1, AND2) and the inverter (INV1, INV2) act to switch the NMOS transistor M7, M8 on/off. In operation, the NMOS transistors M7, M8 operates like a pull down transistor.

In a read operation, the BL_PCHCkt goes to an ON state (logical high). As a result, PMOS transistor (RMUX0) is turned ON when A0_b is a logical low value to select a particular MUX address. When RMUX0 is ON, current flows between the source and drain of RMUX0 so the bit line BL0 discharges through PMOS (RMUX0) and the discharge is transferred to the sense amplifier so that it can resolve the data stored in the corresponding memory cell. In order to resolve the data, the sense amplifier 103 first disconnects from the input multiplexer 102 when the signal A0_b is switched to a logical high state since this causes RMUX0 to turn off (i.e., cause an open circuit between the source and drain of the PMOS (RMUX0). Then the sense amplifier enable signal (SAE) becomes logically high so as to enable the sense amplifier 103.

In the write operation, the BL_PCHCkt goes to an ON state (logical high). A differential voltage signal is created using the write logic block 104 coupled to data line DLNP and the corresponding write logic block 104 coupled to data line DLNPB. Specifically, in the example illustrated in FIG. 6, WrClk, D0, and D1 function to turn M7 and M8 on/off to create a differential voltage between DLNP and DLNPB. The write logic blocks 104 function to create a sense amplifier differential signal. In particular, to write a logical low value to the memory block associated with BL0, A0_b would go to a logical low value to turn on PMOS (RMUX0), transistor M7 would be turned ON causing a short circuit to ground and transistor M8 would be turned OFF (i.e., disconnected from the ground). At the same time, since the output of AND1 would be a logical low value and the output of AND2 would be a logical high value, transistor PU would be OFF (i.e., an open circuit between the source and drain) and transistor PUB would be ON (i.e., a short circuit between the source and drain). In this manner, the voltage at data line DLNP would be a logical low value and the voltage a data line DLNPB would be a logical high value. These voltages would be transferred to the appropriate memory cell using input multiplexer transistor WMUX0. To write a logical high value to the memory cell, transistor M7 would be turned off and transistor M8 would be turned on. At the same time, since the output of AND1 would be a logical high value and the output of AND2 would be a logical low value, transistor PU would be ON (i.e., a short circuit between the source and drain) and transistor PUB would be OFF (i.e., an open circuit between the source and drain). In this manner, the voltage at data line DLNP would be a logical high value and the voltage at data line DLNPB would be a logical low value. These voltages would be transferred to the appropriate memory cell using input multiplexer transistor WMUX0.

Accordingly, the semiconductor memory device 600 illustrated in FIG. 6 is capable of performing read and write operations without a separate write circuit, rather a smaller write logic block 104 is configured to utilize the existing sense amplifier structure to write data to the memory cells. As a result, the read and write operations occur over a shared data line (DLNP, DLNPB).

Figure 7:
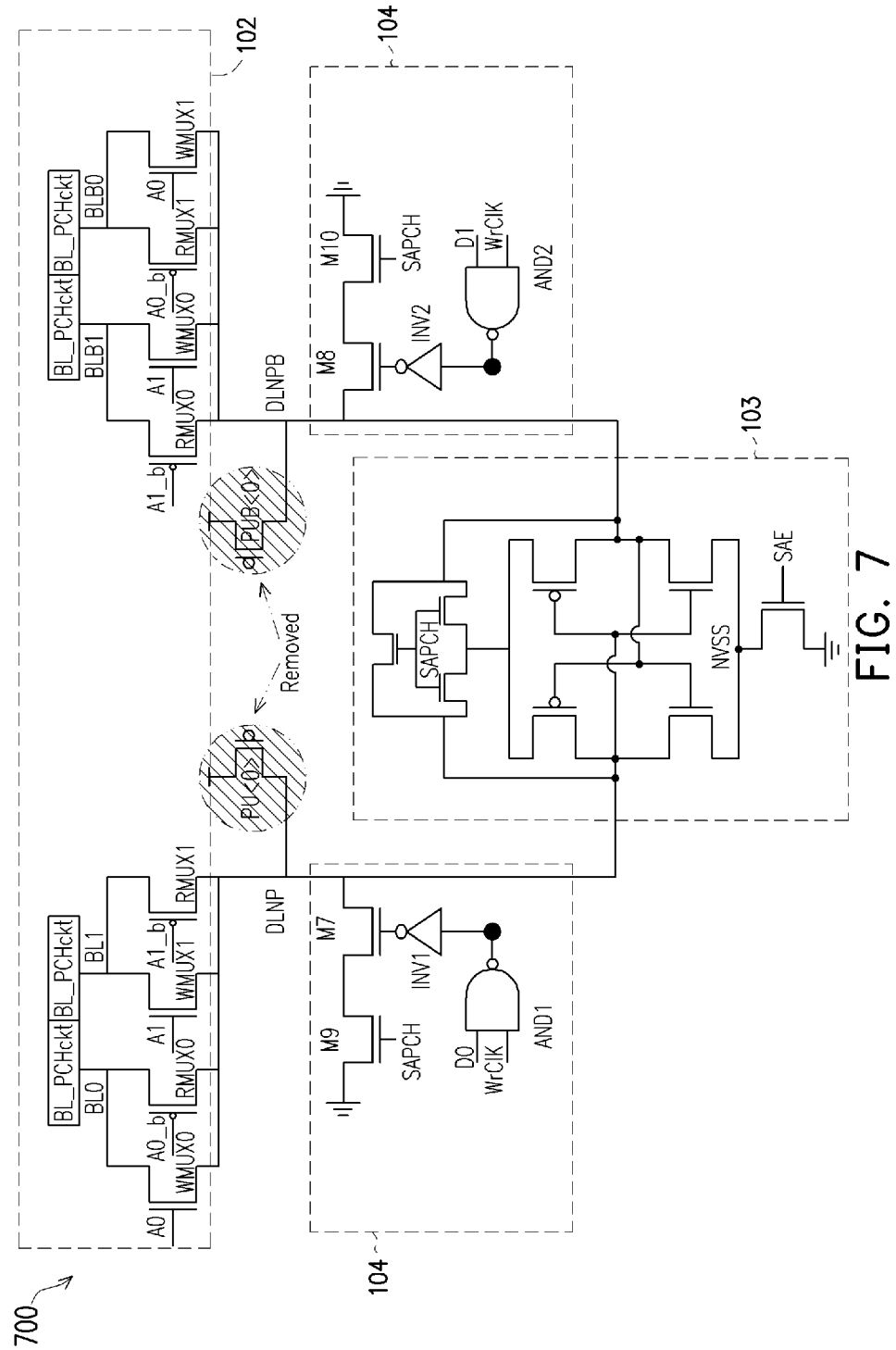
FIG. 7 is a schematic diagram illustrating another example of a combined read/write circuit for a memory device in accordance with some embodiments.

FIG. 7 is a schematic diagram illustrating another example of a combined read/write circuit for a memory device in accordance with some embodiments. The embodiment of the semiconductor memory device 700 in FIG. 7 is similar to the embodiment illustrated in FIG. 6 except an additional transistor M9, M10 is added to the write logic block 104 coupled to data line DLNP and the write logic block 104 coupled to data line DLNPB. The additional transistors M9 and M10 make it possible to remove transistors PU and PUB from FIG. 6 because M9 and M10 can be used to control whether the lines DLNP and DLNPB are shorted to ground. As illustrated, the input (gate) of transistors M9 and M10 are coupled to the same input (SAPCH) as the pre-charge circuit associated with the sense amplifier 103. In this manner, M9 and M10 are only turned on when the pre-charge circuit in the sense amplifier is turned on since they both respond to the same input signal (SAPCH). In addition, a short circuit between the sense amplifier 103 and the data line DLNP is prevented because the transistor M9, M10 is not turned on until the pre-charge circuit in the sense amplifier is turned on so DLNP does not go to a logical low value until sense amplifier 103 is turned on. Using transistors M9 and M10 it is also possible to eliminate pull up transistors PU, PUB illustrated in FIG. 6 since M9 and M10 prevent a short circuit between the sense amplifier 103 and the data line DLNP unless both the pre-charge circuit and the sense amplifier 103 are turned on. As a result, it is not necessary to utilize pull up transistors PU and PUB to control the voltage on lines DLNP and DLNPB and prevent a short circuit. In other words, unlike in FIG. 6, where M7 or M8 alone could cause DLNP or DLNPB to be short circuited if either transistor was turned on, in the circuit shown in FIG. 7, both transistors (M7 and M8 controlled by D0 and WrClk) or (M9 and M10 controlled by SAPCH) must be turned on or there is no path to the ground. In addition, control of transistors M9 and M10 are from a different input signal (SAPCH) than the input signal controlling M7 and M8 which prevents a dummy read.

Figure 8:
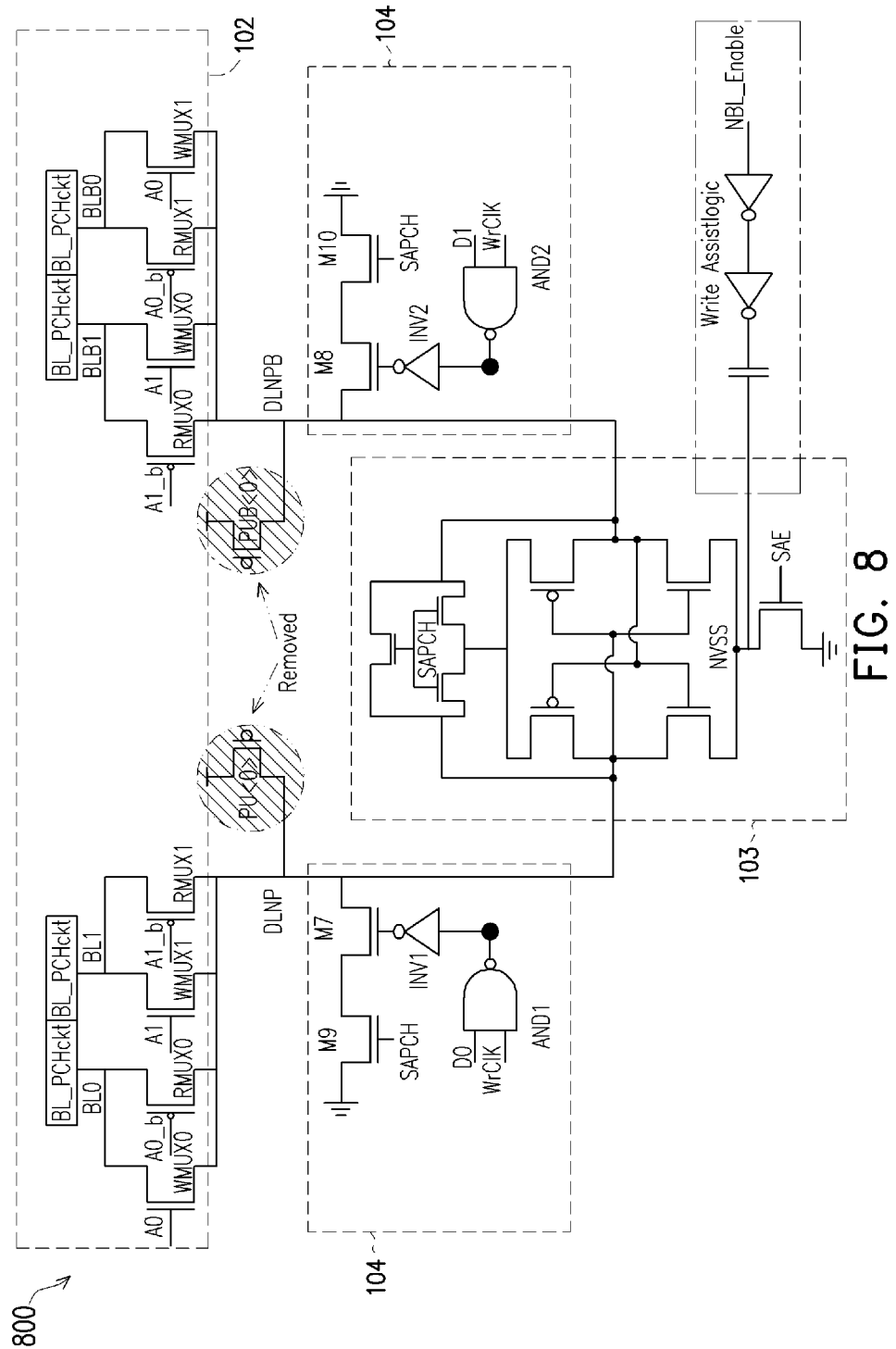
FIG. 8 is a schematic diagram illustrating another example of a combined read/write circuit for a memory device in accordance with some embodiments.

FIG. 8 is a schematic diagram illustrating another example of a combined read/write circuit for a memory device in accordance with some embodiments. The embodiment of the semiconductor memory device 800 in FIG. 8 is similar to the embodiment illustrated in FIG. 7 except write assist logic is included at node NVSS. In some embodiments, the write assist logic may be implemented to enable lower minimum operating voltages by reducing cell variation to make read/write operations less error prone. In particular, in some embodiments, the NBL Enable signal may be utilized to apply a negative voltage to the bit line when a write operation is performed (e.g., a write 0 operation). By applying a negative voltage to the bit line, a larger voltage difference is created between the bit line voltage and the applied voltage. This large voltage differential makes the write operation less error prone since there is a larger voltage range for logical high values and logical low values. In other words, the write operation can be less precise. To assist with this operation, write assist logic circuit includes a pair of inverters that act as a delay element and a capacitor. When the NBL enable signal goes high at the start of the write operation, there is a delay and then the high signal causes a discharge across the capacitor which causes the voltage at NVSS to go from a zero value to a negative value. In the embodiment illustrated in FIG. 8, the write assist logic circuit may be coupled to the sense amplifier 103.

Figure 9B:
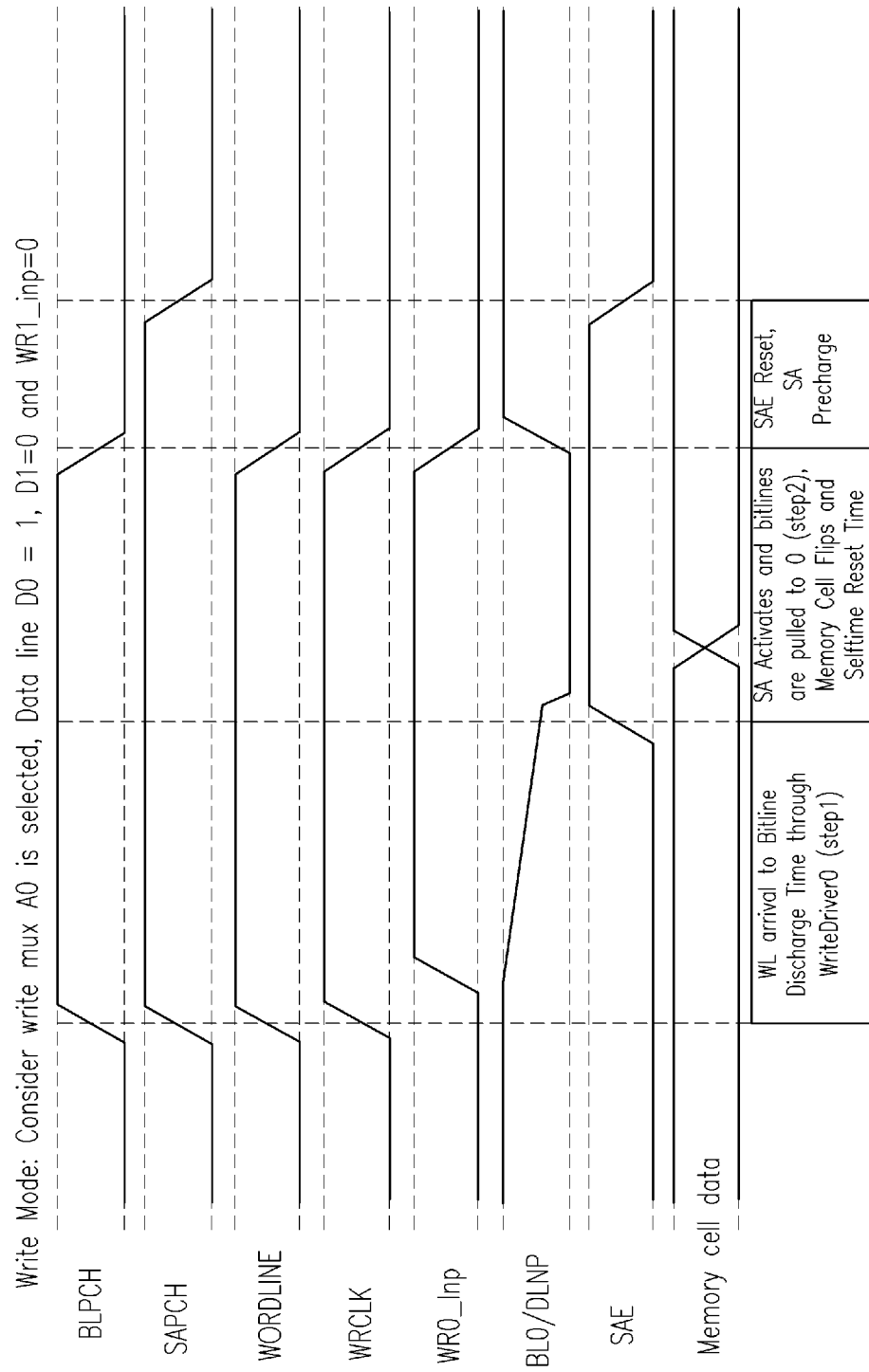

FIGS. 9A and 9B are timing diagrams illustrating exemplary operation of the schematic illustrated in FIGS. 6-8 in accordance with some embodiments. In particular, FIG. 9A illustrates the operation of the circuit in FIGS. 6-8 during a read operation and FIG. 9B illustrates the operation of the circuit in FIGS. 6-8 during a write operation. As illustrated in FIG. 9A, during the read operation, signal WrClk is maintained at a logical low value (0) and read mux A0_b is selected. In this situation, the BLPCH signal and SAPCH signal are both transitioned to a logical high value (1) along with the corresponding WORDLINE. BLB0 and DLNPB are maintained at a logical high value (1) and BLB and DLNP are transitioned to a logical low value over the bitline discharge time. At the start of the SA output and and Selftime Reset Time, the SAE signal is then transitioned to a logical high value (1) once a voltage differential is sensed between DLNP and DLNPB so that the SA_OUTPUT (i.e., the output DL/DLA or DLNP/DLNPB, of the sense amplifier (103) in FIG. 2, FIG. 4, FIG. 6, FIG. 7, and FIG. 8) can be read. The WORDLINE is transitioned back to a logical low value at the beginning of the SAE Reset period. In FIG. 9B, the Mux_A0 is selected and data line D0 is maintained at a logical high value (1). Data line D1 and WR1_inp are both maintained at a logical low value (0). The BLPCH signal, SAPCH signal, WORDLINE, and WRCLK are all transitioned to a logical high value (1). Signal WR0_Inp (corresponding to the output of INV1 in FIG. 6, FIG. 7 and FIG. 8) is transitioned to a logical high value (1). This causes BL0/DLNP to transition to a logical low value over the bitline discharge time. The SAE signal is then transitioned to a logical high value (1) which causes the corresponding memory cell value to flip (e.g., logical low to logical high or logical high to logical low) during the SA Activation time. Finally, The BLPCH signal, WORDLINE, and WRCLK are all transitioned to a logical low value (0) at the start of the SAE reset period.

Figure 10:
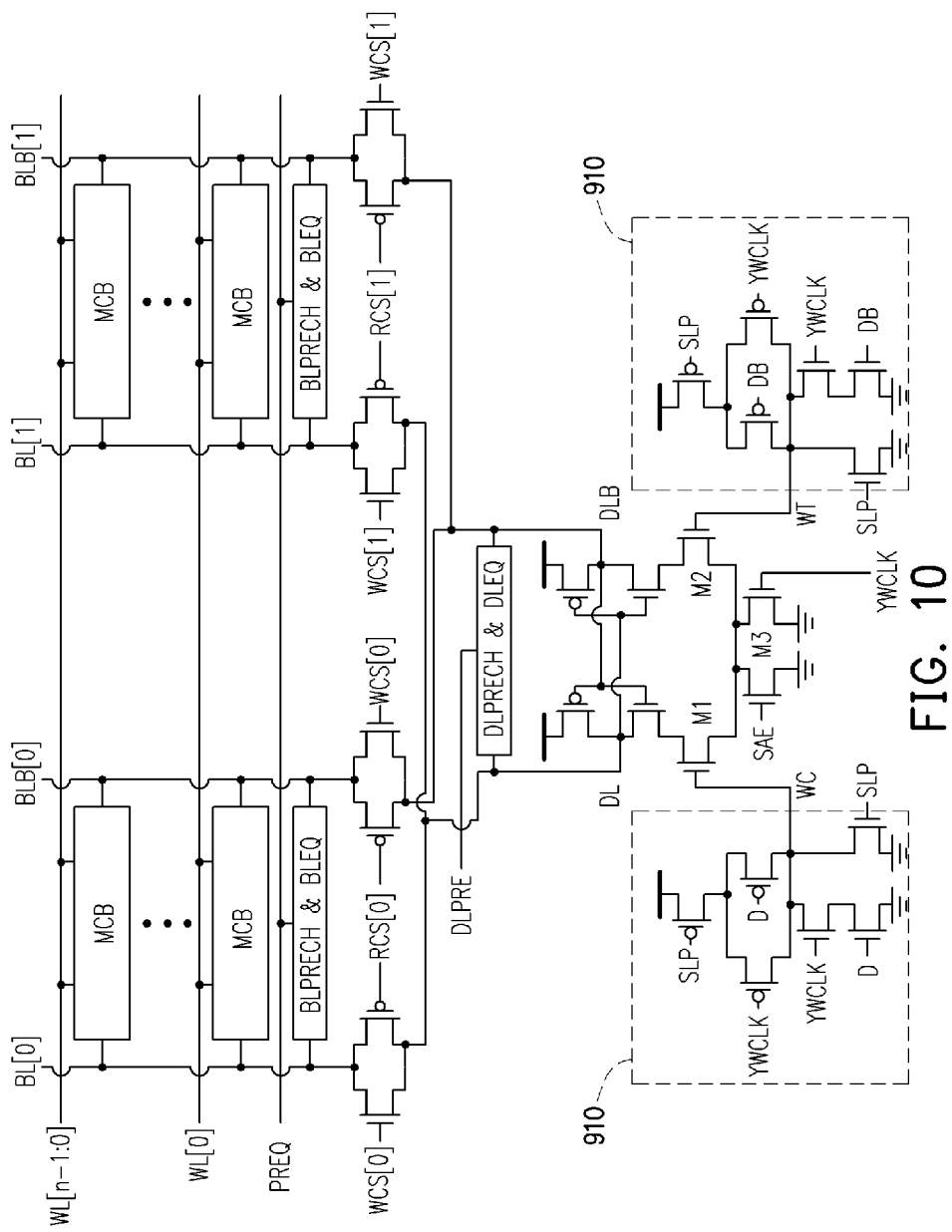
FIG. 10 is a schematic diagram illustrating another example of a combined read/write circuit for a memory device in accordance with some embodiments.

FIG. 10 is a schematic diagram illustrating another example of a combined read/write circuit for a memory device in accordance with some embodiments. The combined read/write circuit illustrated in FIG. 10 is substantially similar to the embodiment illustrated in FIG. 2 except, instead of NAND gates (NAND1 and NAND2), the combined read/write circuit in FIG. 10 includes circuits 910. Circuits 910 operate in a similar manner to the NAND gates described above in that they include inputs D, DB and YWCLK and YWCLKB to control the input WC and WT into transistors M1 and M2. However, the circuits 910 in FIG. 10 further include an input SLP to each circuit. In operation, when the input SLP is a logical high value the corresponding transistor is turned on which causes the outputs WC and WT to transition to a logical low value. The logical low values are input to M1 and M2 which cause them to turn off. This causes a reduction in leakage current since M1 and M2 can be turned off as necessary by using input signal SLP.

Figure 11:
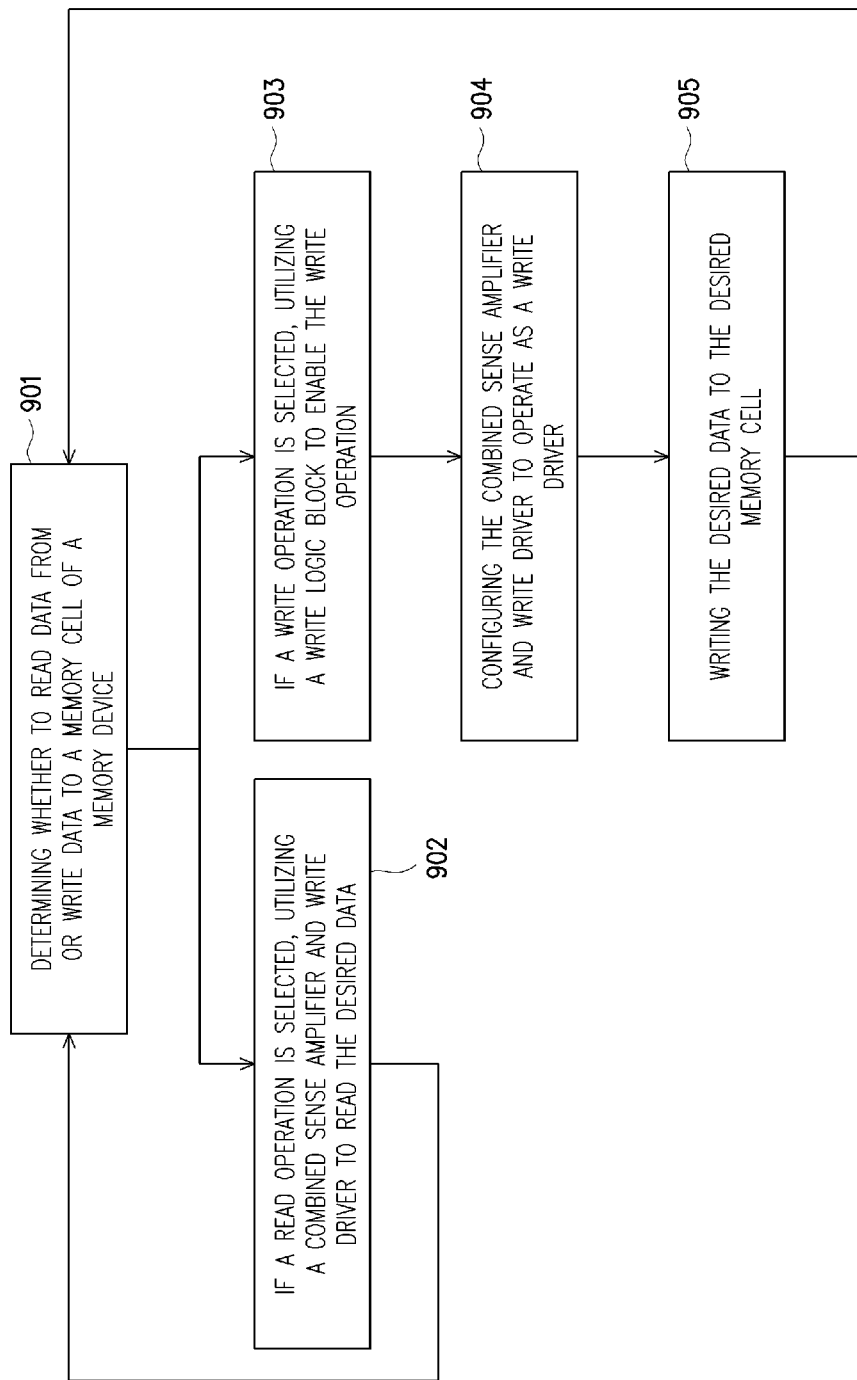
FIG. 11 is a flow diagram illustrating an operation of a memory device in accordance with some embodiments.

FIG. 11 is a flow diagram illustrating an operation of a memory device in accordance with some embodiments. For ease of explanation, the operation of the memory device illustrated in FIG. 11 will be described with reference to the memory 100 in FIG. 1. In operation 901, a determination is made whether to read data from or write data to a memory cell 101 of the memory device 100. In operation 902, if the read operation is selected, the sense amplifier portion of the combined sense amplifier 103 and write driver 104 is utilized to read the desired data. In operation 903, if a write operation is selected, a write logic block 104 is utilized to enable the write operation. In operation 904, the combined sense amplifier and write driver 103 is configured to operate as a write driver. In operation 905, the desired data is written to the desired memory cell 101 via the combined sense amplifier and write driver 103.

Some embodiments described herein may include a semiconductor memory device comprising a plurality of memory cells configured to store digital data and an input multiplexer configured to enable the selection of a particular memory cell from the plurality of memory cells. The semiconductor memory device further comprises a read/write driver circuit configured to read data from the selected memory cell and write data to the selected memory cell, and a write logic block configured to provide logical control to the read/write driver circuit for writing data to the selected of memory cell. The read/write driver circuit may be coupled to the input multiplexer by a data line and an inverted data line and the read and the write operations to the selected memory cell occur over the same data line and inverted data line.

Some embodiments described herein may include a memory device driver circuit comprising an input multiplexer configured to enable the selection of one of a plurality of memory cells for a read/write operation and a sense amplifier and write driver circuit coupled to the read/write input multiplexer by a data line and an inverted data line and configured to read data from the selected memory cell over the data line and inverted data line and write data to the selected memory cell over the same data line and inverted data line. A write logic block configured to provide logical timing control to the sense amplifier and write driver circuit may also be provided for transitioning the sense amplifier and write driver circuit between the read mode of operation to the write mode of operation.

Some embodiments described herein may include an SRAM memory device comprising a plurality of memory cells configured to store digital data and addressable using bit lines and word lines and an input multiplexer configured to enable the selection of a particular one of the plurality of memory cells by selecting a particular bit line for a read operation or a write operation. The SRAM may further include a sense amplifier and write driver circuit configured to read data from the selected memory cell and write data to the selected memory cell, and a write logic block configured to provide logical timing control to the combined sense amplifier and write driver circuit for transitioning the sense amplifier and write driver circuit between the read mode of operation to the write mode of operation. The sense amplifier and write driver circuit may be coupled to the read/write input multiplexer by a data line and an inverted data line and the read and the write operations to the selected memory cell occur over the same data line and inverted data line.

Some embodiments described herein may include a method for operating a memory device comprising determining whether to read data from or write data to a memory cell of the memory device. If the read operation is selected, reading the desired data by a sense amplifier portion of a sense amplifier and write driver circuit. If a write operation is selected utilizing a write logic block to enable the write operation, configuring the combined sense amplifier and write driver circuit to operate as a write driver; and writing the desired data to the desired memory cell via the combined sense amplifier and write driver circuit. The sense amplifier and write driver circuit may be coupled to an input multiplexer by a data line and an inverted data line and the read and the write operations to the selected memory cell occur over the same data line and inverted data line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor memory device comprising:
   a plurality of memory cells configured to store digital data;
   an input multiplexer configured to enable the selection of a particular memory cell;
   a read/write driver circuit configured to read data from the selected memory cell and/or write data to the selected memory cell; and
   a write logic block configured to provide logical control to the read/write driver circuit for writing data to the selected of memory cell;
   wherein the read/write driver circuit is coupled to the input multiplexer by a data line and an inverted data line and the read and the write operations to the selected memory cell occur over the same data line and inverted data line.

2. The semiconductor memory device of claim 1, wherein the read/write driver circuit includes a sense amplifier configured to perform read operations and write operations.

3. The semiconductor memory device of claim 2, further comprising a write assist logic circuit coupled to the sense amplifier.

4. The semiconductor memory device of claim 1, wherein the write logic block comprises a pair of differential MOS transistors and a MOS switch.

5. The semiconductor memory device of claim 1, wherein the write logic block comprises a pair of differential NMOS transistors coupled to corresponding NMOS transistors in the sense amplifier.

6. The semiconductor memory device of claim 1, wherein the write logic block comprises a pair of differential PMOS transistors coupled to corresponding PMOS transistors in the sense amplifier.

7. The semiconductor memory device of claim 1, wherein the write logic block comprises a transistor coupled to the data line and a corresponding transistor coupled to the inverted data line.

8. The semiconductor memory device of claim 1, wherein the read/write driver circuit is configured to transition between a read mode of operation to a write mode of operation based on signal timing.

9. The semiconductor memory device of claim 1, wherein the semiconductor memory device further comprises a pair of transistors associated with the write logic block and configured to assist with pulling the write voltage up to a source voltage during a write operation.

10. A memory device driver circuit comprising:
    an input multiplexer configured to enable the selection of one of a plurality of memory cells for a read/write operation;
    a sense amplifier and write driver circuit coupled to the input multiplexer by a data line and an inverted data line and configured to read data from the selected memory cell over the data line and inverted data line and write data to the selected memory cell over the same data line and inverted data line; and
    a write logic block configured to provide logical timing control to the sense amplifier and write driver circuit for transitioning the sense amplifier and write driver circuit between the read mode of operation to the write mode of operation.

11. The memory device driver circuit of claim 10, wherein the write logic block comprises a pair of differential MOS transistors and a MOS switch.

12. The memory device driver circuit of claim 10, wherein the write logic block comprises a pair of differential NMOS transistors coupled to corresponding NMOS transistors in the sense amplifier.

13. The memory device driver circuit of claim 10, wherein the write logic block comprises a pair of differential PMOS transistors coupled to corresponding PMOS transistors in the sense amplifier.

14. The memory device driver circuit of claim 10, wherein the write logic block comprises a transistor coupled to the data line and a corresponding transistor coupled to the inverted data line.

15. The memory device driver circuit of claim 10, wherein the circuit further comprises a pair of transistors associated with the write logic block and configured to assist with pulling the write voltage up to a source voltage during a write operation.

16. A method for operating a memory device comprising:
    determining whether to read data from or write data to a memory cell of the memory device;
    if the read operation is selected:
       reading the desired data by a sense amplifier portion of a sense amplifier and write driver circuit;
    if a write operation is selected:
       utilizing a write logic block to enable the write operation;
       configuring the sense amplifier and write driver circuit to operate as a write driver; and
       writing the desired data to the desired memory cell via the sense amplifier and write driver circuit;
    wherein the sense amplifier and write driver circuit is coupled to an input multiplexer by a data line and an inverted data line and the read and the write operations to the selected memory cell occur over the same data line and inverted data line.

17. The method of claim 16, wherein the write logic block utilizes a pair of differential MOS transistors and a MOS switch.

18. The method of claim 16, wherein the write logic block utilizes a pair of differential NMOS transistors coupled to corresponding NMOS transistors in the sense amplifier.

19. The semiconductor memory device of claim 16, wherein the write logic block utilizes a pair of differential PMOS transistors coupled to corresponding PMOS transistors in the sense amplifier.

20. The semiconductor memory device of claim 16, wherein the write logic block utilizes a transistor coupled to the data line and a corresponding transistor coupled to the inverted data line.

* * * * *